United States Patent
Amano et al.

(10) Patent No.: US 11,049,966 B2
(45) Date of Patent: Jun. 29, 2021

(54) SILICON CARBIDE SEMICONDUCTOR DEVICE AND METHOD OF MANUFACTURING THE SAME

(71) Applicants: DENSO CORPORATION, Kariya (JP); TOYOTA JIDOSHA KABUSHIKI KAISHA, Toyota (JP)

(72) Inventors: Akira Amano, Kariya (JP); Takayuki Satomura, Kariya (JP); Yuichi Takeuchi, Kariya (JP); Katsumi Suzuki, Toyota (JP); Sachiko Aoi, Nagakute (JP)

(73) Assignees: DENSO CORPORATION, Kariya (JP); TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 16/997,210

(22) Filed: Aug. 19, 2020

(65) Prior Publication Data

US 2020/0381313 A1     Dec. 3, 2020

Related U.S. Application Data

(60) Division of application No. 16/278,314, filed on Feb. 18, 2019, now Pat. No. 10,790,201, which is a continuation of application No. PCT/JP2017/030407, filed on Aug. 24, 2017.

(Continued)

(30) Foreign Application Priority Data

Aug. 31, 2016 (JP) .............................. JP2016-169815

(51) Int. Cl.
*H01L 29/78* (2006.01)
*H01L 21/66* (2006.01)
(Continued)

(52) U.S. Cl.
CPC ...... *H01L 29/7813* (2013.01); *G01B 11/0625* (2013.01); *G01B 11/0675* (2013.01);
(Continued)

(58) Field of Classification Search
CPC ............ H01L 29/7813; H01L 29/1608; H01L 29/7825; H01L 29/66613–66628;
(Continued)

(56) References Cited

U.S. PATENT DOCUMENTS 5,895,939 A * 4/1999 Ueno .................. H01L 29/0623
257/279
6,025,596 A 2/2000 Shirai et al.
(Continued)

FOREIGN PATENT DOCUMENTS

JP     2003-065724 A     3/2003

*Primary Examiner* — Scott B Geyer
(74) *Attorney, Agent, or Firm* — Posz Law Group, PLC

(57) ABSTRACT

When a film thickness of a second epitaxial film is measured, an infrared light is irradiated from a surface side of the second epitaxial film onto a base layer on which a first epitaxial film and the second epitaxial film are formed. A reflected light from an interface between the first epitaxial film and the base layer and a reflected light from a surface of the second epitaxial film are measured to obtain a two-layer film thickness, which is a total film thickness of the first epitaxial film and the second epitaxial film. The film thickness of the second epitaxial film is calculated by subtracting a one-layer film thickness, which is a film thickness of the first epitaxial film, from the two-layer film thickness.

4 Claims, 5 Drawing Sheets

(51) Int. Cl.
  *G01B 11/06* (2006.01)
  *H01L 29/12* (2006.01)
  *H01L 21/265* (2006.01)
  *H01L 29/16* (2006.01)
  *H01L 29/66* (2006.01)

(52) U.S. Cl.
  CPC ........ *H01L 21/26513* (2013.01); *H01L 22/12* (2013.01); *H01L 22/20* (2013.01); *H01L 29/12* (2013.01); *H01L 29/1608* (2013.01); *H01L 29/66068* (2013.01); *H01L 29/78* (2013.01)

(58) Field of Classification Search
  CPC ......... H01L 29/42336; H01L 29/42352; H01L 29/4236; H01L 29/66068; H01L 27/2454; H01L 29/7827; H01L 21/823487; H01L 21/823885
  See application file for complete search history.

(56) References Cited

U.S. PATENT DOCUMENTS

| | | | |
|---|---|---|---|
| 6,825,938 B2 | 11/2004 | Mikami et al. | |
| 8,917,398 B2 | 12/2014 | Aizenberg | |
| 2008/0012026 A1* | 1/2008 | Tsuji | H01L 21/047 |
| 2009/0085044 A1 | 4/2009 | Ohno et al. | |
| 2009/0269861 A1 | 10/2009 | Kurosawa | |
| 2009/0305021 A1 | 12/2009 | Ohkubo | |
| 2012/0161154 A1* | 6/2012 | Mimura | H01L 29/7813 257/77 |
| 2013/0181229 A1 | 7/2013 | Masuda | H01L 29/7813 |
| 2013/0330896 A1* | 12/2013 | Miyahara | H01L 21/3065 438/270 |
| 2013/0341643 A1* | 12/2013 | Kudou | H01L 29/0634 257/77 |
| 2014/0145212 A1 | 5/2014 | Takeuchi et al. | |
| 2014/0239181 A1 | 8/2014 | Hattori et al. | |
| 2015/0236127 A1* | 8/2015 | Miyahara | H01L 21/049 |
| 2016/0104794 A1 | 4/2016 | Takeuchi et al. | |
| 2016/0122904 A1 | 5/2016 | Fukui | |
| 2016/0168751 A1 | 6/2016 | Masumoto et al. | |
| 2016/0247910 A1 | 8/2016 | Suzuki et al. | |
| 2016/0265910 A1 | 9/2016 | Price et al. | |
| 2017/0077299 A1* | 3/2017 | Shimizu | H01L 21/049 |
| 2018/0082841 A1 | 3/2018 | Tawara | |
| 2018/0226246 A1 | 8/2018 | Hamann et al. | |
| 2019/0237536 A1* | 8/2019 | Hiyoshi | H01L 29/12 |
| 2020/0373393 A1* | 11/2020 | Uchida | H01L 29/7813 |

* cited by examiner

SILICON CARBIDE SEMICONDUCTOR DEVICE AND METHOD OF MANUFACTURING THE SAME

CROSS REFERENCE TO RELATED APPLICATIONS

The present application is a divisional application of U.S. Utility application Ser. No. 16/278,314 filed on Feb. 18, 2019, which is a continuation application of International Patent Application No. PCT/JP2017/030407 filed on Aug. 24, 2017, which designated the U.S. and claims the benefit of priority from Japanese Patent Application No. 2016-169815 filed on Aug. 31, 2016. The entire disclosures of all of the above applications are incorporated herein by reference.

TECHNICAL FIELD

The present disclosure relates to a silicon carbide (hereinafter referred to as SIC) semiconductor device and a method of manufacturing an SiC semiconductor device.

BACKGROUND

In manufacturing a semiconductor device, film thicknesses are measured so that the film thickness of each portion has an appropriate value. The Fourier transform infrared spectroscopy (hereinafter referred to as FTIR) is used to measure the film thicknesses. In FTIR, for example, a thin film to be measured is irradiated with an infrared light, an interference light of reflected lights from an interface between a base and the thin film and the surface of the thin film is measured, the interference light is subjected to Fourier-transform to obtain spectra of respective reflected lights, and the film thickness of the thin film is measured.

SUMMARY

The present disclosure provides a silicon carbide semiconductor device and a manufacturing method of a silicon carbide semiconductor device in which a first epitaxial film is formed on a base layer made of silicon carbide, and a second epitaxial film is formed on the first epitaxial film. An infrared light is irradiated from a surface side of the second epitaxial film onto the base layer, and a reflected light from an interface between the first epitaxial film and the base layer and a reflected light from a surface of the second epitaxial film are measured to obtain a two-layer film thickness, which is a total film thickness of the first epitaxial film and the second epitaxial film. A film thickness of the second epitaxial film is calculated by subtracting a one-layer film thickness, which is a film thickness of the first epitaxial film, from the two-layer film thickness.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION

Figure 1:
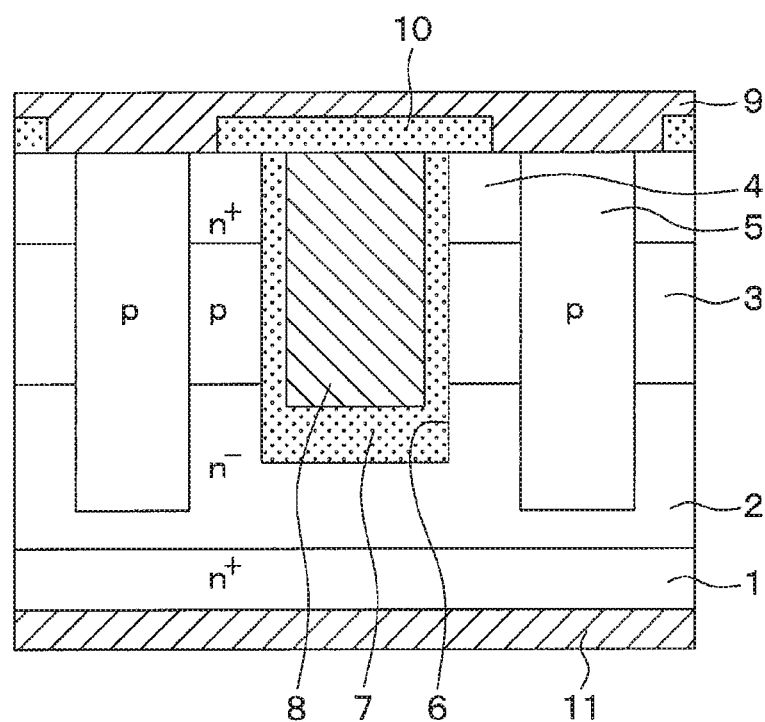
FIG. 1 is a cross-sectional view of an SiC semiconductor device including a MOSFET according to a first embodiment.

A film thickness cannot be measured by FTIR unless the film thickness is within a range determined to some degree. Thus; in a configuration in which a plurality of ion implantation layers and epitaxial layers are present as in an SiC semiconductor device, it is difficult to accurately measure the film thickness of each layer. In particular, when an epitaxial film is formed on SiC serving as a base, it is difficult to measure the film thickness of the epitaxial film because a difference in impurity concentration between SiC serving as the base and the epitaxial film is small. Further, even when a monitor substrate without an epitaxial film is additionally used for the purpose of evaluating the film thickness, if a target film thickness of the thin film to be measured is thin, an accurate spectrum cannot be obtained by overlapping with a center burst region, and a film thickness measurement is hardly performed with higher accuracy. Thus, it is difficult to obtain an SIC semiconductor device which is controlled to have a desired film thickness.

In a manufacturing method of a silicon carbide semiconductor device according an aspect of the present disclosure, a structure in which a first epitaxial film having a film thickness of 5 μm to 14 μm is formed on a base layer made of silicon carbide is prepared. An infrared light is irradiated from a surface side of the first epitaxial film, and a first film thickness, which is the film thickness of the first epitaxial film, Is measured by Fourier transform infrared spectroscopy based on a reflected light from an interface between the first epitaxial film and the base layer and a reflected light from a surface of the first epitaxial film. A second epitaxial film having a film thickness of 0.5 μm to 2.0 μm is formed on the first epitaxial film. An infrared light is irradiated from a surface side of the second epitaxial film, and a second film thickness, which is a total film thickness of the first epitaxial film and the second epitaxial film, is measured by Fourier transform infrared spectroscopy based on the reflected light from the interface between the first epitaxial film and the base layer and a reflected light from a surface of the second epitaxial film. The film thickness of the second epitaxial film is calculated by subtracting the first film thickness from the second film thickness, and the film thickness of the second epitaxial film is controlled.

When the second epitaxial film having the film thickness of 0.5 μm to 2.0 μm is formed on the first epitaxial film having the film thickness of 5 μm to 14 μm, the second film thickness can be measured while the first film thickness is measured with high accuracy. Thus, the thickness of the second epitaxial film can be calculated with high accuracy by subtracting the first film thickness from the second film thickness. Therefore, the SiC semiconductor device in which the film thicknesses are accurately controlled can be manufactured.

In a manufacturing method of a silicon carbide semiconductor device according to another aspect of the present disclosure, a structure in which a first epitaxial film having a film thickness of 5 µm to 14 µm is formed on a base layer made of silicon carbide is prepared. An infrared light is irradiated from a surface side of the first epitaxial film, and a first film thickness, which is the film thickness of the first epitaxial film, is measured by Fourier transform infrared spectroscopy based on a reflected light from an interface between the first epitaxial film and the base layer and a reflected light from a surface of the first epitaxial film. A second epitaxial film having a film thickness of 0.5 µm to 2.0 µm is formed on the first epitaxial film. An infrared light is irradiated from a surface side of the second epitaxial film, and a second film thickness, which is a total film thickness of the first epitaxial film and the second epitaxial film, is measured by Fourier transform infrared spectroscopy based on the reflected light from the interface between the first epitaxial film and the base layer and a reflected light from a surface of the second epitaxial film. The film thickness of the second epitaxial film is calculated by subtracting the first film thickness from the second film thickness, and the second epitaxial film is removed by etching back by the film thickness that is calculated.

Even when the second epitaxial film is etched back, it is necessary to measure the film thickness of the second epitaxial film with high accuracy. Also in this case, when the second epitaxial film having the thickness of 0.5 µm to 2.0 µm is formed on the first epitaxial film having the thickness of 5 µm to 14 µm, the second film thickness can be measured while the first film thickness is measured with high accuracy. Thus, the thickness of the second epitaxial film can be calculated with high accuracy by subtracting the first film thickness from the second film thickness. Therefore, the SiC semiconductor device in which the film thickness of the second epitaxial film can be etched back accurately, and the film thicknesses are controlled accurately can be manufactured.

A silicon carbide semiconductor device according to another aspect of the present disclosure includes a vertical MOSFET that includes a substrate, a drift layer, a base region, a source region, a trench gate structure, a source electrode, and a drain electrode. The substrate forms a base layer and is made of silicon carbide of a first conductivity type or a second conductivity type. The drift layer is formed on the substrate and is made of an epitaxial film of silicon carbide of the first conductivity type. The base region is formed on the drift layer and is made of an epitaxial film of silicon carbide of the second conductivity type. The source region is formed on an upper layer portion of the base region and is made of silicon carbide of the first conductivity type having a higher impurity concentration than an impurity concentration of the drift layer. The trench gate structure is formed in a gate trench formed deeper than the base region from a surface of the source region, and includes a gate insulating film formed on an inner wall surface of the gate trench and a gate electrode formed on the gate insulating film. The source electrode is electrically connected to the source region. The drain electrode is electrically connected to a rear surface of the substrate. A film thickness of the drift layer is set to 5 µm to 14 µm, a film thickness of the base region is set to 0.5 µm to 2.0 µm, and an amount of protrusion of the gate trench from a bottom of the base region is set to 0.2 µm to 0.4 µm.

In the above-described silicon carbide semiconductor device, since the thickness of the base region can be accurately set, the base region is not formed to be thicker than necessary, and a low on-resistance can be achieved. Further, since the film thicknesses of the base region and the source region can be accurately set, the amount of protrusion of the gate trench can be accurately set, and high reverse-bias reliability can be ensured.

Embodiments of the present disclosure will be described below with reference to the drawings. In the following respective embodiments, parts identical with or equivalent to each other are denoted by the same symbols for description.

First Embodiment

A first embodiment will be described. An SiC semiconductor device according to the present embodiment has a MOSFET formed as shown in FIG. 1. The MOSFET is formed in a cell region of the SiC semiconductor device, and the SiC semiconductor device is configured by forming an outer peripheral high breakdown voltage structure so as to surround the cell region. However, only the MOSFET is shown.

In the SiC semiconductor device, an $n^+$-type substrate 1 made of SiC is used as a semiconductor substrate. An $n^-$-type drift layer 2 made of SiC, a p-type base region 3, and an $n^+$-type source region 4 are epitaxially grown in the stated order on a main surface of the $n^+$-type substrate 1.

The $n^+$-type substrate 1 has, for example, an n-type impurity concentration of $1.0 \times 10^{19}/cm^3$, and a surface of a (0001) Si plane. The $n^-$-type drift layer 2 has, for example, an n-type impurity concentration of $0.5 \times 10^{16}/cm^3$ to $2.0 \times 10^{16}/cm^3$ and a thickness of 5 µm to 14 µm.

The p-type base region 3 is a portion in which a channel region is formed, and has a p-type impurity concentration of, for example, about $2.0 \times 10^{17}/cm^3$ and a thickness of 0.5 µm to 2 µm. The $n^+$-type source region 4 has a higher impurity concentration than the $n^-$-type drift layer 2, and has an n-type impurity concentration at a surface layer portion of, for example, $2.5 \times 10^{13}/cm^3$ to $1.0 \times 10^{19}/cm^3$ and a thickness of about 0.5 µm to 2 µm. The film thicknesses of the n-type drift layer 2, the p-type base region 3, and the $n^+$-type source region 4 are arbitrarily set, but a total film thickness is set to fall within a range of 5 µm to 16 µm.

P-type deep layers 5 are formed so as to penetrate the $n^+$-type source region 4 and the p-type base region 3 and reach the $n^-$-type drift layer 2. The p-type deep layers 5 have a p-type impurity concentration higher than that of the p-type base region 3. Specifically, the multiple p-type deep layers 5 are disposed at regular intervals in the $n^-$-type drift layer 2 and disposed at a distance without intersecting with each other, so that an upper surface layout is a striped shape. For example, each of the p-type deep layers 5 has a p-type impurity concentration of, for example, $1.0 \times 10^{17}/cm^3$ to $1.0 \times 10^{19}/cm^3$, a width of 0.7 µm, and a depth of 0.4 µm or more deeper than a total film thickness of the p-type base region 3 and the $n^+$-type source region 4.

In addition, a gate trench 6 is formed to have, for example, a width of 0.8 µm and a depth of 0.2 µm to 0.4 µm deeper than a total film thickness of the p-type base region 3 and the $n^+$-type source region 4, so as to penetrate through the p-type base region 3 and the $n^+$-type source region 4 and reach the $n^-$-type drift layer 2. The p-type base region 3 and the $n^+$-type source region 4 described above are disposed so as to be in contact with a side surface of the gate trench 6. The gate trench 6 is formed in a line-shaped layout in which a right and left direction of the paper of FIG. 1 is defined as a width direction, a normal direction of the paper is defined as a longitudinal direction, and an upper and lower direction of the paper is defined as a depth direction. Although only one gate trench 6 is shown in FIG. 1, multiple gate trenches 6 are disposed at a regular interval in the right and left direction of the paper, and each of the gate trenches 6 is sandwiched between the p-type deep layers 5 so as to have a stripe shape.

In addition, when a portion of the p-type base region 3 located on a side surface of the gate trench 6 is defined as a channel region connecting the n$^+$-type source region 4 and the n$^-$-type drift layer 2 when a vertical MOSFET is operated, a gate insulating film 7 is formed on an inner wall surface of the gate trench 6 including the channel region. A gate electrode 8 made of doped poly-Si is formed on a surface of the gate insulating film 7, and an inside of the gate trench 6 is filled with the gate insulating film 7 and the gate electrode 8.

A source electrode 9 corresponding to the first electrode is formed on surfaces of the n$^+$-type source region 4 and the p-type deep layers 5 and a surface of the gate electrode 8 across an interlayer insulating film 10. The source electrode 9 and the like are made of multiple metals, for example, Ni/Al and the like. A portion of the multiple metals contacting at least n-type SiC, specifically, the n$^+$-type source region 4 and the gate electrode 8 in the case of the n-type doping, is made of metals that can make an ohmic contact with the n-type SiC. A portion of the multiple metals contacting at least p-type SiC, specifically, the p-type deep layers 5 is made of a metal that can make an ohmic contact with the p-type SiC, The source electrode 9 and the like are electrically insulated by being formed on the interlayer insulating film 10. The source electrode 9 is brought into electric contact with the n$^+$-type source region 4 and the p-type deep layers 5 through contact holes provided in the interlayer insulating film 10.

Further, a drain electrode 11 corresponding to a second electrode electrically connected to the n$^+$-type substrate 1 is formed on a rear surface of the n$^+$-type substrate 1. The structure described above configures a MOSFET of an n-channel type inverted trench gate structure. The cell region is formed by disposing multiple cells of the MOSFET described above. The SiC semiconductor device is configured with the outer peripheral high breakdown voltage structure using a guard ring (not shown) or the like so as to surround the cell region in which the MOSFET described above is formed.

In the SiC semiconductor device configured in this manner, since the n-type drift layer 2 formed on the n$^+$-type substrate 1 is relatively thick from 5 to 14 μm, the film thickness can be measured by well-known FTIR. Namely, an infrared light is irradiated from the n$^+$-type drift layer 2 side onto the n$^+$-type substrate 1 on which the n$^-$-type drift layer 2 has been grown, and an interference light of reflected lights from an interface between the n$^-$-type drift layer 2 and the n$^+$-type substrate 1 and a surface of the n$^-$-type drift layer 2 is measured. Then, spectra of the respective reflected lights are obtained by Fourier transforming the interference light, thereby being capable of measuring the film thickness of the n$^-$-type drift layer 2.

However, the p-type base region 3 and the n$^+$-type source region 4 formed on the n$^-$-type drift layer 2 have very small film thicknesses of 0.5 μm to 2.0 μm. Thus, the film thickness of the p-type base region 3 cannot be measured using reflections from the interface between the n$^-$-type drift layer 2 and the p-type base region 3 serving as a base, and from the surface of the p-type base region 3. Similarly, the film thickness of the n$^+$-type source region 4 cannot be measured using the reflections from the interface between the p-type base region 3 and the n$^+$-type source region 4 serving as the base and from the surface of the n$^+$-type source region 4.

However, with the measurement of the film thicknesses of the p-type base region 3 and the n$^+$-type source region 4 by a method to be described below, the p-type base region 3 and the n$^+$-type source region 4 can be formed with small film thickness variations. Thus, the amount of protrusion of the gate trench 6 formed from the surface of the n$^+$-type source region 4 from a bottom surface of the p-type base region 3 can be accurately set, and the amount of protrusion can be kept within 0.2 μm to 0.4 μm, for example. When the amount of protrusion of the gate trench 6 is too large, a distance of the gate trench 6 from the n$^+$-type substrate 1 becomes short, and the breakdown voltage against a reverse bias decreases. Therefore, the amount of protrusion is kept within the above range, and reliability against the reverse bias can be secured, Therefore, the thickness of the p-type base region 3 can be accurately set to achieve a low on-resistance, and the amount of protrusion of the gate trench 6 can be accurately set to be able to ensure a high reverse bias reliability.

Next, a method of manufacturing the SiC semiconductor device having the MOSFET with the n-channel type inverted trench gate structure according to the present embodiment will be described with reference to cross-sectional views during a manufacturing process shown in FIG. 2A to FIG. 3D.

Figure 2A:
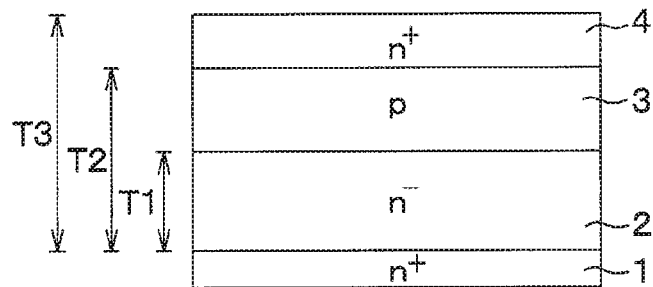
FIG. 2A to FIG. 2D are cross-sectional views showing processes of manufacturing the SiC semiconductor device shown in FIG. 1.

[Process Shown in FIG. 2A]

First, the n$^+$-type substrate 1 is prepared as a semiconductor substrate. The n$^-$-type drift layer 2, the p-type base region 3, and the n$^+$-type source region 4 made of SiC are epitaxially grown in the stated order on the main surface of the n$^+$-type substrate 1. In this case, when forming the n-type drift layer 2, the p-type base region 3, and the n$^+$-type source region 4, processes of measuring the respective film thicknesses are performed.

Figure 4:
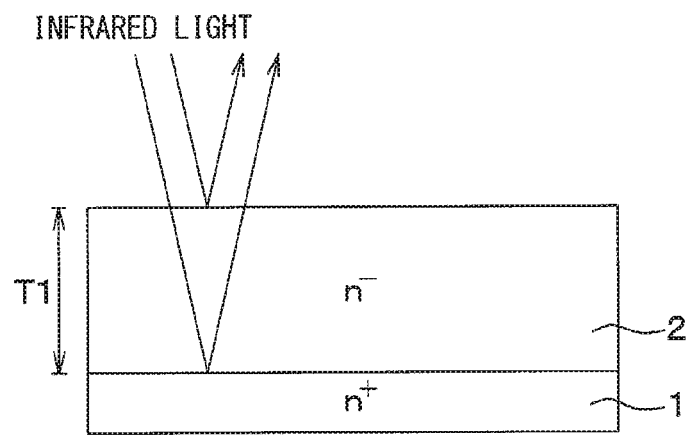
FIG. 4 is a cross-sectional view showing a state of measuring a film thickness of an n$^-$-type drift layer.

First, after the n$^-$-type drift layer 2 is formed in a film thickness of 5 μm to 14 μm, a process of measuring the film thickness of the n$^-$-type drift layer 2 (hereinafter referred to as a one-layer film thickness T1) is performed. Specifically, as shown in FIG. 4, the infrared light is irradiated from the n$^-$-type drift layer 2 side onto the n$^+$-type substrate 1 on which the n$^-$-type drift layer 2 has been grown, and the interference light of the reflected lights from the interface between the n-type drift layer 2 and the n$^+$-type substrate 1 and the surface of the n$^-$-type drift layer 2 is measured. Then, the spectrum of each reflected light can be obtained by Fourier transforming the interference light, and the one-layer film thickness T1 can be measured. At this time, since the n$^-$-type drift layer 2 is formed in a film thickness of 5 μm to 14 μm, the one-layer film thickness T1 can be accurately measured by FTIR, and it can be accurately confirmed that a desired film thickness is achieved.

Figure 5:
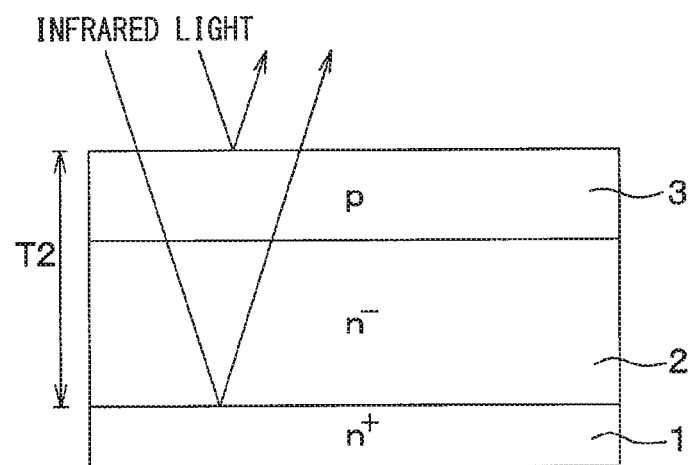
FIG. 5 is a cross-sectional view showing a state of measuring a film thickness of a p-type base region.

Subsequently, after the p-type base region 3 is formed on the n$^-$-type drift layer 2 in a film thickness of 0.5 μm to 2 μm, a process of measuring the film thickness of the p-type base region 3 is performed. Specifically, as shown in FIG. 5, the infrared light is irradiated from the p-type base region 3 side onto the n$^+$-type substrate 1 on which the p-type base region 3 and the n$^-$-type drift layer 2 have been grown. Then, the interference light of not the reflected light from the interface between the p-type base region 3 and the n$^-$-type drift layer 2, but the reflected light from the interface between the n$^-$-type drift layer 2 and the n$^+$-type substrate 1 and the reflected light from the surface of the p-type base region 3 is measured. In the above manner, a total film thickness of the p-type base region 3 and the n$^-$-type drift layer 2

(hereinafter referred to as a two-layer film thickness T2) can be measured. Therefore, the film thickness of the p-type base region 3 can be calculated by calculating T2−T1 obtained by subtracting the previously measured one-layer film thickness T1 from the two-layer film thickness T2.

In the film thickness measurement by FTIR, repeatability is required. The repeatability means that when a thin film is formed on the base, a variation in the measurement result when the film thickness of the thin film is repeatedly measured is reduced. If the repeatability is high and the variation in the measurement result is small, the film thickness measurement accuracy when the thin film is formed is high.

Figure 6:
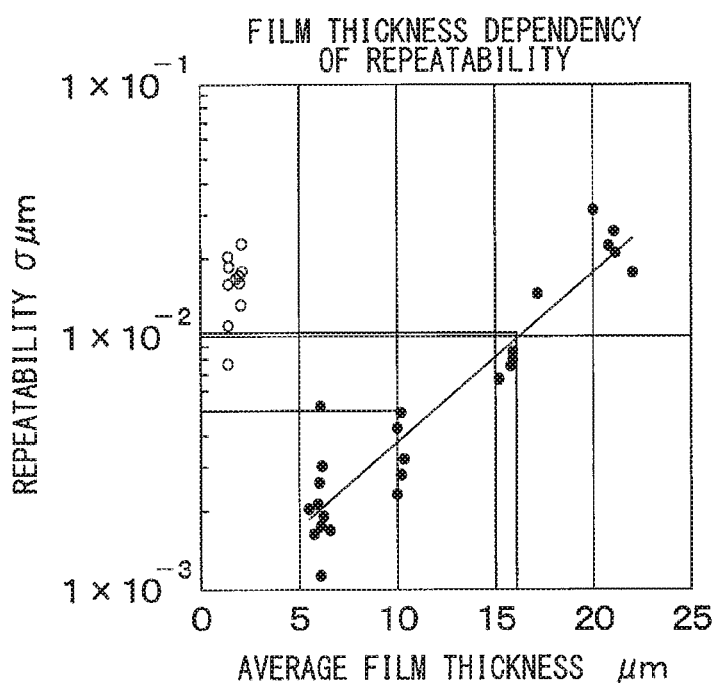
FIG. 6 is a diagram showing a relationship between an average film thickness and a repeatability.

The film thickness dependency of the repeatability is examined, and a result shown in FIG. 6 is obtained. Specifically, substrates on which epitaxial films having average film thicknesses of approximately 2 μm, 6 μm, 10 μm, 16 μm, and 22 μm in a plane are formed are prepared, and the film thicknesses of the epitaxial films are repeatedly measured by FTIR. As a result, in the case where the average film thickness is 2 μm or 20 μm, the repeatability is about 0.02 μm, but in the case where the average film thickness is 5 μm to 16 μm, the repeatability is 0.01 μm or less. Especially when the average film thickness is between 5 μm and 10 μm, the repeatability is 0.005 μm or less.

From the above result, it can be understood that the high repeatability can be obtained if the film thickness of the epitaxial film to be measured falls at least within a range of 5 μm to 16 μm, and the film thickness measurement accuracy when the epitaxial film is formed can be improved to 0.01 μm. Thus, when the film thickness of the $n^-$-type drift layer 2 is set to be 5 μm to 14 μm, the measuring accuracy of the one-layer film thickness T1 can be restricted to 0.01 μm at the maximum.

Further, when the p-type base region 3 is formed on the $n^-$-type drift layer 2, since the p-type base region 3 has a film thickness of 0.5 μm to 2 μm, the two-layer film thickness T2 ranges from 5.5 μm to 16 μm. Thus, the film thickness measurement accuracy of the two-layer film thickness T2 can be restricted to 0.01 μm at the maximum. Since the film thickness measurement accuracy of the two-layer film thickness T2 is 0.01 μm at the maximum and the film thickness measurement accuracy of the one-layer film thickness T1 is 0.01 μm at the maximum, the film thickness measurement accuracy of the p-type base region 3 obtained by subtracting the one-layer film thickness T1 from the two-layer film thickness T2 is 0.02 μm at the maximum.

Therefore, when the process of measuring the film thickness of the p-type base region 3 is performed by the method described above, the film thickness of the p-type base region 3 can be evaluated with a film thickness measurement accuracy of 0.02 μm or less, and the p-type base region 3 can be set to have a desired film thickness.

Further, if the film thickness of the $n^-$-type drift layer 2 is set within the range of 5 μm to 10 μm and the total film thickness of the $n^-$-type drift layer 2 and the p-type base region 3 is also within the range of 5 μm to 10 μm, the film thickness measuring accuracy of the one-layer film thickness T1 and the two-layer film thickness T2 becomes 0.005 μm at the maximum. Therefore, in that case, the film thickness of the p-type base region 3 can be evaluated with a film thickness measurement accuracy of 0.01 μm or less, and the p-type base region 3 can be set to have a desired film thickness with higher accuracy.

Thereafter, the $n^+$-type source region 4 is formed in the thickness of 0.5 μm to 2.0 μm on the p-type base region 3. Then, the film thickness of the $n^+$-type source region 4 is measured. Also in this case, an infrared light is irradiated from the $n^+$-type source region 4 side to measure not the reflected light from the interface between the $n^+$-type source region 4 and the p-type base region 3, but the interference light of the reflected light from the interface between the $n^-$-type drift layer 2 and the $n^+$-type substrate 1 and the reflected light from the surface of the $n^-$-type source region 4. In this way, the total film thickness of the $n^-$-type source region 4, the p-type base region 3, and the $n^+$-type drift layer 2 (hereinafter, referred to as a three-layer film thickness T3) can be measured. Therefore, the film thickness of the $n^+$-type source region 4 can be calculated by calculating T3−T2 obtained by subtracting the two-layer film thickness T2 measured in advance from the three-layer film thickness T3.

At this time, if the film thickness of each of the $n^-$-type drift layer 2, the p-type base region 3, and the $n^+$-type source region 4 is set so that the three-layer film thickness T3 falls within the range of 5 μm to 16 μm, the film thickness of the $n^+$-type source region 4 can be evaluated with a film thickness measurement accuracy of 0.02 μm or less. Therefore, the $n^+$-type source region 4 can have a desired film thickness.

Further, if the two-layer film thickness T2 is set within the range of 5 μm to 10 μm and the three-layer film thickness T3 is also set within the range of 5 μm to 10 μm, a variation between the two-layer film thickness T2 and the three-layer film thickness T3 becomes 0.005 μm at the maximum. Therefore, the film thickness of the $n^+$-type source region 4 can be evaluated with a film thickness measurement accuracy of 0.01 μm or less, and the $n^+$-type source region 4 can be set to have a desired film thickness with higher accuracy.

When the $n^-$-type drift layer 2, the p-type base region 3, and the $n^+$-type source region 4 are formed in this manner, those elements can be formed with highly precisely controlled film thicknesses.

Figure 2B:
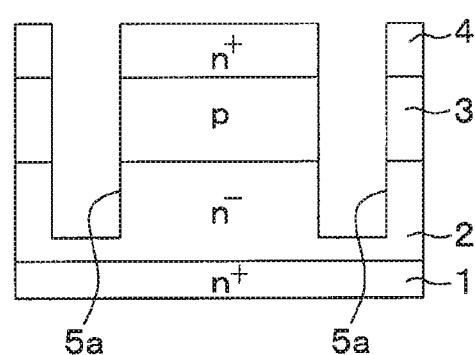

[Process Shown in FIG. 2B]

Next, a mask (not shown) is disposed on the surface of the $n^+$-type source region 4, and a region of the mask where the p-type deep layer 5 is to be formed is opened. Then, anisotropic etching such as reactive ion etching (RIE) is performed with the use of a mask to form trenches 5a having a predetermined width.

Figure 2C:
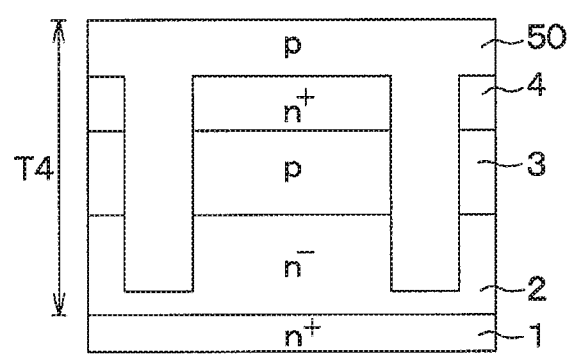

[Process Shown in FIG. 2C]

After removal of the mask, a p-type layer 50 is formed. At this time, the p-type layer 50 is buried in the trench 5a by burying epitaxial. Since the trenches 5a are formed in a line shape having a narrow width, the p-type layer 50 can be surely buried in the trench 5a.

Figure 2D:
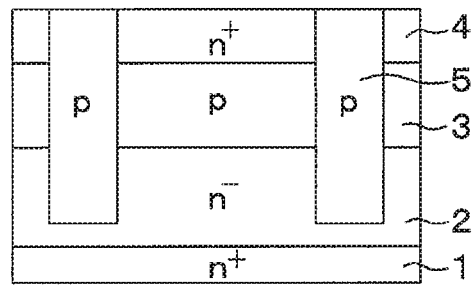

[Process Shown in FIG. 2D]

The p-type layer 50 is etched back by dry etching so that a portion of the p-type layer 50 formed above a surface of the $n^+$-type source region 4 is removed. As a result, the p-type deep layer 5 is formed.

Figure 3A:
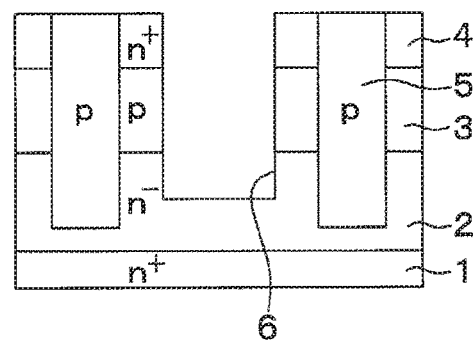
FIG. 3A to FIG. 3D are cross-sectional views showing processes of manufacturing the SiC semiconductor device continued from FIG. 2D.

[Process Shown in FIG. 3A]

After a mask (not shown) is formed on the $n^+$-type source region 4 or the like, a region of the mask where the gate trench 6 is to be formed is opened. Then, anisotropic etching such as RIE is performed with the use of the mask to form the gate trench 6.

At this time, since the p-type base region 3 and the $n^+$-type source region 4 are formed with a film thickness controlled with high accuracy as described above, the amount of protrusion of the gate trench 6 from the lower portion of the p-type base region 3 can be accurately set when the gate trench 6 is provided. For example, as described above, the p-type base region 3 is set to 0.5 μm to 2 μm, and the $n^+$-type source region 4 is set to 0.5 μm to 2 μm. Thus, if etching is performed with a setting that a depth of the gate trench 6 is to be 0.2 µm to 0.4 µm deeper than the total film thickness of the p-type base region 3 and the n⁺-type source region 4, the amount of protrusion of the gate trench 6 from the bottom portion of the p-type base region 3 can be accurately adjusted to 0.2 µm to 0.4 µm.

Figure 3B:
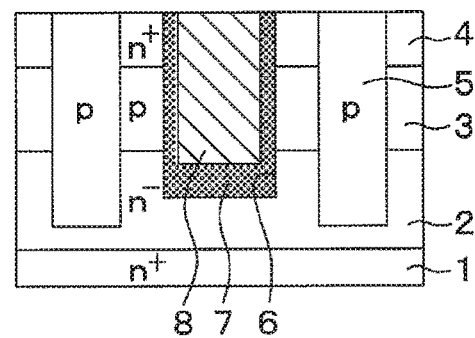

[Process Shown in FIG. 3B]

After the mask has been removed, the gate insulating film 7 is formed by, for example, thermal oxidation, and the gate insulating film 7 covers an inner wall surface of the gate trench 6 and a surface of the n⁺-type source region 4. Then, after depositing Poly-Si doped with a p-type impurity or an n-type impurity, Poly-Si is etched back to leave at least Poly-Si in the gate trench 6, thereby forming the gate electrodes 8.

Figure 3C:
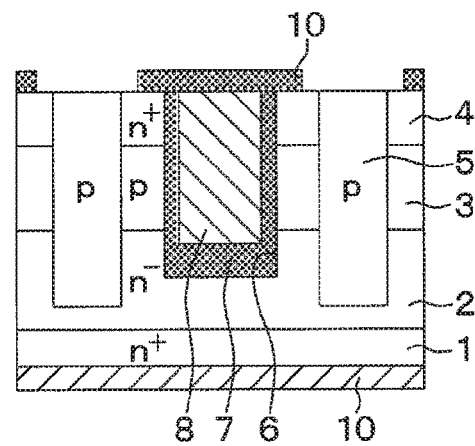

[Process Shown in FIG. 3C]

The interlayer insulating film 10 made of, for example, an oxide film is formed so as to cover the surfaces of the gate electrode 8 and the gate insulating film 7. After a mask (not shown) is formed on the surface of the interlayer insulating film 10, a portion of the mask located between the gate electrodes 8, that is, a portion corresponding to the p-type deep layer 5 and the vicinity of the portion are opened. Thereafter, the interlayer insulating film 10 is patterned with the use of a mask to form contact holes exposing the p-type deep layer 5 and the n⁺-type source region 4.

Figure 3D:
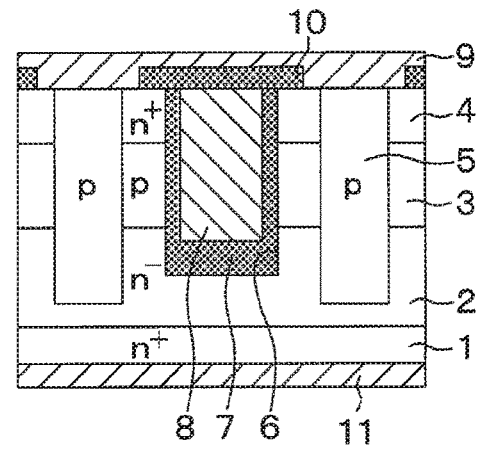

[Process Shown in FIG. 3D]

An electrode material having, for example, a multilayer structure of multiple metals is formed on the surface of the interlayer insulating film 10. Then, the source electrode 9 is formed by patterning the electrode material.

The SiC semiconductor device according to the present embodiment is completed by performing a process of forming the drain electrodes 11 on the rear surface of the n⁺-type substrate 1, although the subsequent process is not illustrated.

As described above, when the p-type base region 3 and the n⁺-type source region 4 are formed in accordance with the present embodiment, those regions can be formed with a highly precisely controlled film thickness. Accordingly, an SiC semiconductor device in which the film thicknesses are accurately controlled can be provided.

Since the thickness of the p-type base region 3 can be accurately set, the p-type base region 3 is not formed to be thicker than necessary, and a low on-resistance can be achieved. Further, since the film thicknesses of the p-type base region 3 and the n⁺-type source region 4 can be accurately set, the amount of protrusion of the gate trench 6 can be accurately set, and high reverse-bias reliability can be ensured.

Second Embodiment

A second embodiment will be described. In the present embodiment, an object of the film thickness measurement is changed with respect to the first embodiment, and the remaining portion is the same as in the first embodiment, and therefore, only portions different from the first embodiment will be described.

In the first embodiment described above, the film thickness measurement of the p-type base region 3 or the n⁺-type source region 4 has been described. In the present embodiment, FTIR similar to that of the first embodiment is used for measuring a film thickness of a p-type deep layer 5 at the time of etch-back, in other words, measuring the amount of etch-back.

In other words, in the process shown in FIG. 2C described in the first embodiment, after the trench 5a has been formed, the p-type layer 50 is formed to bury the p-type layer 50 in the trench 5a, but at that time, the p-type layer 50 is also formed on the n⁺-type source region 4. In this case, FTIR is used to measure a film thickness of the p-type layers 50 on the n⁺-type source region 4. When the film thickness of the p-type layer 50 is measured with precision, the amount of etch-back of the p-type layer 50 can be defined with precision.

Specifically, in the process shown in FIG. 2A, when the n⁻-type drift layer 2, the p-type base region 3, and the n⁺-type source region 4 are epitaxially grown in the stated order on the main surface of the n⁺-type substrate 1, the three-layer film thickness T3 is measured. At that time, a triple epitaxial substrate in which the n⁻-type drift layer 2, the p-type base region 3 and the n⁺-type source region 4 are epitaxially grown in order on the main surface of the n⁺-type substrate 1 may be prepared in advance. Then, the processes shown in FIG. 2B and FIG. 2C are performed. As a result, the p-type layer 50 is formed so as to fill the trench 5a, and the p-type layer 50 is also formed on the n⁺-type source region 4. In this situation, a film thickness measurement process of the p-type layer 50 is performed.

First, as described in FIG. 2O, a total film thickness of the n⁻-type drift layer 2, the p-type base region 3, the n⁺-type source region 4, and the p-type layer 50 (hereinafter referred to as a four-layer film thickness T4) is measured. A film thickness of the p-type layer 50 can be calculated by calculating T4−T3 obtained by subtracting the three-layer film thickness T3 from the four-layer film thickness T4.

At that time, the film thickness of each of the n⁻-type drift layer 2, the p-type base region 3, the n⁺-type source region 4, and the p-type layer 50 is set so that the three-layer film thickness T3 falls within a range of 5 µm to 16 µm and the four-layer film thickness T4 also falls within a range of 5 µm to 16 µm. Accordingly, the film thickness of the p-type layer 50 can be evaluated with a film thickness measurement accuracy of 0.02 µm or less. Further, if the three-layer film thickness T3 is set within the range of 5 µm to 10 µm and the four-layer film thickness T4 is also set within the range of 5 µm to 10 µm, a variation in the three-layer film thickness T3 and the four-layer film thickness T4 becomes 0.005 µm at the maximum. Therefore, in that case, the film thickness of the p-type layer 50 can be evaluated with a film thickness measurement accuracy of 0.01 µm or less.

Thus, when the p-type layer 50 is etched back, only the p-type layer 50 can be removed from the surface of the n⁺-type source region 4 by the film thickness of the p-type layer 50 based on an etching condition such as an etching time.

Further, at the time of etch-back, the etching surface may be irradiated with an infrared light, and a film thickness from an interface between the n⁻-type drift layer 2 and the n⁺-type substrate 1 to the etching surface (hereinafter referred to as the etching surface film thickness T5) may be measured by FTIR. In that case, the remaining amount of the p-type layer 50 can be grasped by calculating T5−T3 obtained by subtracting the three-layer film thickness T3 from the etching surface film thickness T5. Therefore, if the residue of the p-type layer 50 is confirmed by the measurement at the time of etching back, the etching back can be performed with higher accuracy by repeating the etching back again, and only the p-type layer 50 can be removed more accurately.

As a result, a thickness variation of the n⁺-type source region 4 after the etch-back can be reduced, and as a result, when the gate trench 6 is formed from the surface of the n⁺-type source region 4, the amount of protrusion of the gate trench 6 from the bottom of the p-type base region 3 can be accurately set.

Third Embodiment

A third embodiment will be described. The present embodiment is different from the first embodiment in that an ion implantation layer is formed before the film thickness measurement, but is otherwise the same as the first embodiment, and therefore, only portions different from the first embodiment will be described.

In the first embodiment described above, the p-type layer 50 is formed on the trench 5a and the p-type deep layer 5 is formed by etch-back. Alternatively, the p-type deep layer 5 can also be formed by ion implantation. However, in the case where the p-type deep layer 5 is formed by ion implantation, since a range of ion implantation is shortened in SiC, it is preferable to perform ion implantation every time an epitaxial film is formed, for example.

Figure 7A:
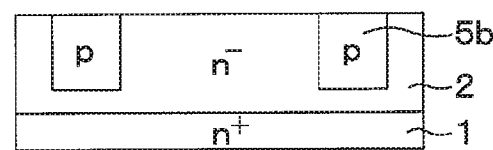
FIG. 7A to FIG. 7C are cross-sectional views showing a part of processes of manufacturing an SiC semiconductor device including a MOSFET according to a third embodiment.
Figure 7B:
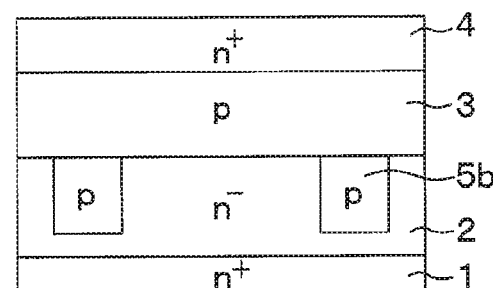

More specifically, as shown in FIG. 7A, after the n⁻-type drift layer 2 has been formed, a mask (not shown) in which a region where the p-type deep layer 5 is to be formed is opened is disposed and ion implantation is performed to form a lower layer portion 5b of the p-type deep layer 5. Thereafter, as shown in FIG. 7B, a p-type base region 3 is formed, and an n⁺-type source region 4 is further formed. At that time, according to the process described in the first embodiment, the film thickness measurement process of the p-type base region 3 is performed after the p-type base region 3 has been formed, and the film thickness measurement process of the n⁺-type source region 4 is performed after the n⁺-type source region 4 has been formed. As a result, the film thickness of the p-type base region 3 and the n⁺-type source region 4 can be accurately measured.

Figure 7C:
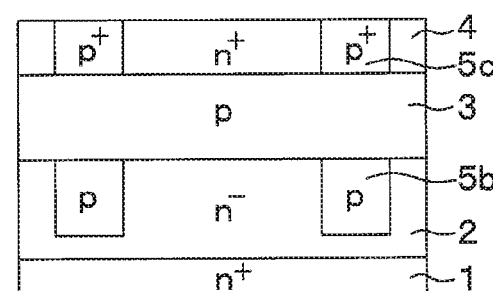

Then, as shown in FIG. 7C, a mask (not shown) in which a region where the p-type deep layer 5 is to be formed is opened is disposed on the n⁺-type source region 4, and ion implantation is performed to form a contact portion 5c of the p-type deep layer 5. At that time, as long as the contact portion 5c is formed so as to be in contact with at least the p-type base region 3, since the contact portion 5c has the same conductivity type, the contact portion 5c is electrically connected with the lower layer portion 5b. Thus, the contact portion 5c does not need to be in contact with the lower layer portion 5b.

As described above, the p-type deep layer 5 can also be formed by ion implantation. In that case, when performing the film thickness measurement process of the p-type base region 3 and the n⁺-type source region 4, an ion implantation layer is formed below those regions. In some cases, the film thickness measurement cannot be performed if such an ion implantation layer is formed. However, according to the method described above, the film thickness of the p-type base region 3 and the film thickness of the n⁺-type source region 4 can be accurately measured regardless of whether an ion implantation layer is formed. Therefore, even if there is an ion implantation layer formed by ion implantation of at least a part of the p-type deep layer 5, an accurate film thickness measurement can be performed, and the same effects as in the first embodiment can be obtained.

OTHER EMBODIMENTS

Although the present disclosure has been described in accordance with the embodiments described above, the present disclosure is not limited to the embodiments described above, and encompasses various modifications and variations within the scope of equivalents. In addition, various combinations and configurations, as well as other combinations and configurations that include only one element, more, or less, are within the scope and spirit of the present disclosure.

For example, in the first embodiment, the n⁺-type substrate 1 is exemplified as the base layer, the n⁻-type drift layer 2 is exemplified as the first epitaxial film, and the p-type base region 3 is exemplified as the second epitaxial film. However, this is merely an example, and in a structure in which the first epitaxial film and the second epitaxial film are stacked on the base layer, the above-described film thickness measuring process by FTIR can be performed when measuring the film thickness of the second epitaxial film. In addition, the n⁺-type source region 4 is exemplified as the third epitaxial film, but this is just one example. When the film thickness of the third epitaxial film is measured, the above-described film thickness measuring process by FTIR can be performed. In the case of the first and third embodiments, the one-layer film thickness T1 corresponds to a first film thickness, the two-layer film thickness T2 corresponds to a second film thickness, and a three-layer film thickness T3 corresponds to a third film thickness.

In the second embodiment, the n⁺-type substrate 1 is exemplified as the base, a stacked film of the n⁻-type drift layer 2, the p-type base region 3, and the n⁺-type source region 4 is exemplified as the first epitaxial film, and the p-type layer 50 is exemplified as the second epitaxial film. However, this is merely an exemplary case, and in a structure in which the first epitaxial film is formed on the base layer and the second epitaxial film is stacked on the first epitaxial film, the above-described film thickness measuring process by FTIR can be performed when measuring the film thickness of the second epitaxial film. In the case of the second embodiment, the three-layer film thickness T3 corresponds to the first thickness, and the four-layer film thickness T4 corresponds to the second film thickness.

In the first embodiment, after forming the n⁻-type drift layer 2, the p-type base region 3, and the n⁺-type source region 4, the film thickness is measured by FTIR. On the other hand, the film thicknesses can be measured during the deposition of the n-type drift layer 2, the p-type base region 3, and the n⁺-type source region 4 by providing a film thickness measurement mechanism by FTIR in the epitaxial growth device for forming those components. Accordingly, the film thicknesses can be controlled more accurately. Similarly, in the second embodiment, the film thickness is measured by FTIR after the etch-back of the p-type layer 50. On the other hand, if the etching device for etching back the p-type layer 50 is provided with a film thickness measurement mechanism using FTIR, the film thickness can be measured during the etching of the p-type layer 50. Accordingly, the film thickness can be controlled more accurately.

In the above-described embodiments, the MOSFET is exemplified as an element included in the SiC semiconductor device, but the element is not limited to the MOSFET, and other elements may be formed in the SiC semiconductor device. Further, although the n-channel type MOSFET in which the first conductivity type is the n-type and the second conductivity type is the p-type has been exemplified, a p-channel type MOSFET in which the conductivity types of the respective components are inverted may be used. In the descriptions described above, the MOSFET is exemplified as the semiconductor device, but the present disclosure can be applied to an IGBT having a similar structure. The IGBT only changes the conductivity type of the n⁺-type substrate 1 from the n-type to the p-type for each of the embodiments described above, and the structures and manufacturing methods of the substrate are the same as those of the above respective embodiments. Further, although the trench gate structure is exemplified as the vertical MOSFET, the vertical MOSFET is not limited to the trench gate structure, and may be a planar type.

What is claimed is:

1. A silicon carbide semiconductor device comprising a vertical MOSFET that includes:
    a substrate forming a base layer and made of silicon carbide of a first conductivity type or a second conductivity type;
    a drift layer formed on the substrate and made of an epitaxial film of silicon carbide of the first conductivity type;
    a base region formed on the drift layer and made of an epitaxial film of silicon carbide of the second conductivity type;
    a source region formed on an upper layer portion of the base region and made of silicon carbide of the first conductivity type having a higher impurity concentration than an impurity concentration of the drift layer;
    a trench gate structure formed in a gate trench formed deeper than the base region from a surface of the source region, and including a gate insulating film formed on an inner wall surface of the gate trench and a gate electrode formed on the gate insulating film;
    a source electrode electrically connected to the source region; and
    a drain electrode electrically connected to a rear surface of the substrate,
    wherein
    a film thickness of the drift layer is set to 5 μm to 14 μm, a film thickness of the base region is set to 0.5 μm to 2.0 μm, and an amount of protrusion of the gate trench from a bottom of the base region is set to 0.2 μm to 0.4 μm.

2. The silicon carbide semiconductor device according to claim 1, wherein
    the source region is made of an epitaxial film, and a total film thickness of the drift layer, the base region, and the source region is set to 5 μm to 16 μm.

3. The silicon carbide semiconductor device according to claim 1, further comprising:
    a trench deeper than the gate trench and formed in the drift layer; and
    a deep layer of the second conductivity type disposed in the trench.

4. The silicon carbide semiconductor device according to claim 1, wherein
    the film thickness of the drift layer is set to 5 μm to 10 μm,
    a total film thickness of the drift layer and the base region is set to 5 μm to 10 μm, and
    a total film thickness of the drift layer, the base region, and the source region is set to 5 μm to 10 μm.

* * * * *